United States Patent
Yang et al.

(10) Patent No.: US 11,056,626 B2
(45) Date of Patent: Jul. 6, 2021

(54) MICRO LIGHT EMITTING DEVICE DISPLAY APPARATUS AND METHOD OF FABRICATING THE SAME

(71) Applicant: PlayNitride Display Co., Ltd., MiaoLi County (TW)

(72) Inventors: Shiang-Ning Yang, MiaoLi County (TW); Chih-Ling Wu, MiaoLi County (TW); Yi-Min Su, MiaoLi County (TW); Bo-Wei Wu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 16/711,400

(22) Filed: Dec. 11, 2019

(65) Prior Publication Data
US 2021/0050495 A1   Feb. 18, 2021

(30) Foreign Application Priority Data
Aug. 16, 2019   (TW) .................. 108129200

(51) Int. Cl.
*H01L 33/60*   (2010.01)
*H01L 33/62*   (2010.01)
*H01L 33/00*   (2010.01)

(52) U.S. Cl.
CPC .......... *H01L 33/60* (2013.01); *H01L 33/0095* (2013.01); *H01L 33/62* (2013.01);
(Continued)

(58) Field of Classification Search
CPC .................. H01L 33/60; H01L 2933/0058; H01L 27/156
See application file for complete search history.

(56) References Cited

U.S. PATENT DOCUMENTS

2014/0061687 A1   3/2014   Hu et al.
2014/0339495 A1*  11/2014  Bibl .................. H01L 33/504
                                                257/13
(Continued)

FOREIGN PATENT DOCUMENTS

CN   1472776   2/2004
TW   I647742   1/2019

OTHER PUBLICATIONS

"Office Action of Taiwan Counterpart Application", dated Aug. 27, 2020, p. 1-p. 5.

*Primary Examiner* — Marcos D. Pizarro
*Assistant Examiner* — Antonio B Crite
(74) *Attorney, Agent, or Firm* — JCIPRNET (57) ABSTRACT

A micro light emitting device display apparatus including a circuit substrate, a plurality of epitaxial structures, a plurality of contact pads and a plurality of light shielding patterns is provided. The plurality of epitaxial structures are dispersedly arranged on the circuit substrate. The plurality of contact pads are disposed between the plurality of epitaxial structures and the circuit substrate. The plurality of epitaxial structures are electrically connected to the circuit substrate via the plurality of contact pads respectively. The plurality of light shielding patterns and the plurality of contact pads are alternately arranged on the circuit substrate, and each of the light shielding patterns is connected between two adjacent contact pads without overlapping with the contact pads and is adapted to block light with a wavelength ranging from 150 nm to 400 nm from penetrating through. A method of fabricating the micro light emitting device display apparatus is also provided.

18 Claims, 6 Drawing Sheets

(52) U.S. Cl.
CPC .................. *H01L 2933/0058* (2013.01); *H01L 2933/0066* (2013.01)

(56) References Cited

U.S. PATENT DOCUMENTS

| | | |
|---|---|---|
| 2016/0218143 A1 | 7/2016 | Chaji et al. |
| 2017/0062674 A1* | 3/2017 | Kwon ................. H01L 25/0753 |
| 2018/0138071 A1 | 5/2018 | Bower et al. |
| 2019/0229097 A1 | 7/2019 | Takeya et al. |

* cited by examiner

MICRO LIGHT EMITTING DEVICE DISPLAY APPARATUS AND METHOD OF FABRICATING THE SAME

CROSS-REFERENCE TO RELATED APPLICATION

This application claims the priority benefit of Taiwan application serial no. 108129200, filed on Aug. 16, 2019. The entirety of the above-mentioned patent application is hereby incorporated by reference herein and made a part of this specification.

BACKGROUND OF THE INVENTION

Field of the Invention

The disclosure relates to a display apparatus and a method of fabricating the same, and particularly relates to a micro light emitting device display apparatus and a method of fabricating the same.

Description of Related Art

In recent years, as an organic light-emitting diode (OLED) display panel has higher manufacturing cost and the shorter life time than the current mainstream display, the micro LED display gradually attracts the investment from various technology companies. In addition to the advantages of low power consumption and long material life, the micro LED display also has excellent optical performance, such as high color saturation, fast response and high contrast.

At present, in the manufacturing process of a micro light emitting device display apparatus, the mass transfer technology plays a very important role. Micro light emitting devices which are fabricated in advance and stored on a temporary substrate are transferred to a circuit substrate of an application end-product (such as a display apparatus) via a transfer head. However, in terms of the transfer accuracy of the current mass transfer technology, there is still a problem for production yield of an ultra high definition (UHD) display apparatus. Even if the epitaxial structure is directly formed on the circuit substrate of the display apparatus without adopting the mass transfer technology, there is still a problem of light emitting efficiency. Therefore, how to improve the production yield of the micro light emitting device display apparatus while still achieving display performance (such as light emitting efficiency and UHD) is an important issue faced by relevant manufacturers.

SUMMARY OF THE INVENTION

The invention is directed to a micro light emitting device display apparatus with better display quality.

The invention is directed to a method of fabricating the micro light emitting device display apparatus, which has a high production yield.

The micro light emitting device display apparatus of the invention includes a circuit substrate, a plurality of epitaxial structures, a plurality of contact pads and a plurality of light shielding patterns. The plurality of epitaxial structures is dispersedly arranged on the circuit substrate. The plurality of contact pads are disposed between the plurality of epitaxial structures and the circuit substrate. The plurality of epitaxial structures are electrically connected to the circuit substrate via the plurality of contact pads respectively. The plurality of light shielding patterns and the plurality of contact pads are alternately arranged on the circuit substrate, and each of the light shielding patterns is connected between two adjacent contact pads without overlapping with the contact pads and can block light with a wavelength ranging from 150 nm to 400 nm from penetrating through.

In an embodiment of the invention, the circuit substrate of the micro light emitting device display apparatus has a surface, a first surface of each of the contact pads has a first height from the surface of the circuit substrate, a second surface of each of the light shielding patterns has a second height from the surface of the circuit substrate, and the second height is less than or equal to the first height.

In an embodiment of the invention, each of the contact pads of the micro light emitting device display apparatus includes a first sub-contact pad and a second sub-contact pad, the first sub-contact pad is connected to one of the epitaxial structures, and the second sub-contact pad is connected between the first sub-contact pad and the circuit substrate. Each of the first sub-contact pads has a first length in a direction, each of the second sub-contact pads has a second length in the direction, and the first length is equal to or less than the second length.

In an embodiment of the invention, a Young's modulus of the light shielding patterns of the micro light emitting device display apparatus ranges from 2.9 GPa to 3.6 GPa.

In an embodiment of the invention, the plurality of light shielding patterns of the micro light emitting device display apparatus are connected to each other and surround the plurality of contact pads.

In an embodiment of the invention, the micro light emitting device display apparatus further includes a planarization layer and a conductive layer. The planarization layer is disposed between the plurality of epitaxial structures. The planarization layer covers a side surface of each of the epitaxial structures. The conductive layer covers the plurality of epitaxial structures and the planarization layer and is electrically connected to the epitaxial structures.

In an embodiment of the invention, the micro light emitting device display apparatus further includes a reflective layer disposed between the plurality of epitaxial structures.

In an embodiment of the invention, the epitaxial structure of the micro light emitting device display apparatus includes a first-type semiconductor layer, a light emitting layer and a second-type semiconductor layer. The first-type semiconductor layer is electrically connected to a corresponding contact pad. The light emitting layer is disposed on the first-type semiconductor layer. The second-type semiconductor layer is disposed on the light emitting layer. The reflective layer is higher than the light emitting layer.

In an embodiment of the invention, the reflective layer of the micro light emitting device display apparatus has a first thickness in a normal direction of the circuit substrate, the light emitting layer and the first-type semiconductor layer have a second thickness in the normal direction of the circuit substrate, and the first thickness is greater than the second thickness.

In an embodiment of the invention, the micro light emitting device display apparatus further includes a light absorbing layer disposed on the reflective layer.

In an embodiment of the invention, each of the epitaxial structures of the micro light emitting device display apparatus has a top surface and a bottom surface which are opposite to each other and a side surface connected to the top surface and the bottom surface. The side surface has a first part and a second part. The first part is connected to the second part to form a turning position, and a width of the epitaxial structure gradually increases from the top surface to the turning position and gradually decreases from the turning position to the bottom surface.

The method of fabricating the micro light emitting device display apparatus provided by the invention includes: forming an epitaxial layer on an epitaxial substrate, and forming a plurality of first sub-contact pads separated from each other on the epitaxial layer; forming a plurality of second sub-contact pads separated from each other on the circuit substrate; bonding the epitaxial substrate to the circuit substrate; electrically bonding the first sub-contact pads and the second sub-contact pads to form a plurality of contact pads electrically connected to the epitaxial layer and the circuit substrate; forming a plurality of light shielding patterns between the epitaxial substrate and the circuit substrate; and after the circuit substrate is bonded to the epitaxial substrate, removing the epitaxial substrate and etching the epitaxial layer to form a plurality of epitaxial structures. The plurality of light shielding patterns and the plurality of second sub-contact pads are alternately arranged on the circuit substrate, the light shielding patterns are not overlapped with the second sub-contact pads, and the light shielding patterns can block light with a wavelength ranging from 150 nm to 400 nm from penetrating through. The plurality of epitaxial structures respectively correspond to the plurality of contact pads and are electrically connected to the circuit substrate via the contact pads respectively.

In an embodiment of the invention, the method of fabricating the micro light emitting device display apparatus further includes: forming the plurality of light shielding patterns on the epitaxial layer before the epitaxial substrate is bonded to the circuit substrate.

In an embodiment of the invention, the method of fabricating the micro light emitting device display apparatus further includes: forming the plurality of light shielding patterns on the circuit substrate before the epitaxial substrate is bonded to the circuit substrate.

In an embodiment of the invention, according to the method of fabricating the micro light emitting device display apparatus, each of the first sub-contact pads has a first length in a direction, each of the second sub-contact pads has a second length in the direction, and the first length is equal to or less than the second length.

In an embodiment of the invention, the method of fabricating the micro light emitting device display apparatus further includes: performing a thinning process on the epitaxial substrate. The step of removing the epitaxial substrate includes performing a laser lift-off process.

In an embodiment of the invention, the method of fabricating the micro light emitting device display apparatus further includes: forming a reflective layer between the plurality of epitaxial structures.

In an embodiment of the invention, the method of fabricating the micro light emitting device display apparatus further includes: forming a light absorbing layer on the reflective layer.

In an embodiment of the invention, according to the method of fabricating the micro light emitting device display apparatus, each of the epitaxial structures has a top surface and a bottom surface which are opposite to each other and a side surface connected to the top surface and the bottom surface. The side surface has a first part and a second part. The first part is connected to the second part to form a turning position, and a width of the epitaxial structure gradually increases from the top surface to the turning position and gradually decreases from the turning position to the bottom surface.

Based on the above, in the micro light emitting device display apparatus and the method of fabricating the same according to an embodiment of the invention, by the arrangement of the plurality of light shielding patterns, the circuit substrate can be prevented from being damaged in the process of removing the epitaxial substrate. Furthermore, when the micro light emitting device display apparatus is enabled, the light shielding patterns can also prevent the light beams emitted from the epitaxial structures from entering the circuit substrate, thereby being favorable for improving the operational stability of a driving circuit and the reliability under long-time operation. On the other hand, after the epitaxial layer is bonded to the circuit substrate, a part of the epitaxial layer is removed and a plurality of epitaxial structures are formed, so that the fabrication of the micro light emitting device display apparatus with better display quality can be realized, and the light emitting efficiency of the formed epitaxial structures is also better.

In order to make the aforementioned and other objectives and advantages of the invention comprehensible, embodiments accompanied with figures are described in detail below.

DESCRIPTION OF THE EMBODIMENTS

Reference will now be made in detail to the present exemplary embodiments of the invention, examples of which are illustrated in the accompanying drawings. Wherever possible, the same reference numbers are used in the drawings and the description to refer to the same or like parts.

FIG. 1A to FIG. 1H are cross-sectional schematic views of fabricating processes of a micro light emitting device display apparatus according to a first embodiment of the invention. FIG. 2 is a top view of contact pads and light shielding patterns in FIG. 1H. Firstly, referring to FIG. 1H, a micro light emitting device display apparatus 1 includes a circuit substrate 50, a plurality of epitaxial structures 110P and a plurality of contact pads 120. The plurality of epitaxial structures 110P are dispersedly arranged on the circuit substrate 50, and the plurality of contact pads 120 are disposed between the epitaxial structures 110P and the circuit substrate 50. The plurality of epitaxial structures 110P are electrically connected to the circuit substrate 50 via the contact pads 120 respectively. In the present embodiment, the circuit substrate 50 is, for example, a complementary metal-oxide-semiconductor (CMOS) substrate, a liquid crystal on silicon (LCOS) substrate, a thin film transistor (TFT) substrate or other substrates with operating circuits.

Further, the micro light emitting device display apparatus 1 further includes a plurality of light shielding patterns 130. The light shielding patterns 130 and the plurality of contact pads 120 are alternately arranged on the circuit substrate 50, and each of the light shielding patterns 130 is connected between two adjacent contact pads 120. In the present embodiment, the light shielding patterns 130 are connected to each other and surround the plurality of contact pads 120 (as shown in FIG. 2), but the invention is not limited thereto. In other embodiments, the plurality of light shielding patterns 130 can be separated from each other. In the present embodiment, each of the contact pads 120 protrudes from the circuit substrate 50 by a first height H1, each of the light shielding patterns 130 protrudes from the circuit substrate 50 by a second height H2, and the first height H1 can be substantially equal to the second height H2. That is, the surface 120s of each of the contact pads 120 connected to the epitaxial structure 110P can substantially align with the surface 130s of each of the light shielding patterns 130. The light shielding patterns 130 can block light with a wavelength ranging from 150 nm to 400 nm from penetrating through. In other words, most of the light with a wavelength ranging from 150 nm to 400 nm can be absorbed or reflected by the light shielding patterns 130 without penetrating. In the present embodiment, the light shielding patterns 130 can block the laser light with a wavelength of 248 nm from penetrating through. For example, the Young's modulus of the light shielding patterns 130 may range from 2.9 GPa to 3.6 GPa. The material of the light shielding patterns 130 in the present embodiment is an organic material, such as photoresist, benzo cyclobutene (BCB), polyimide (PI) and an organic rubber material.

On the other hand, the micro light emitting device display apparatus 1 also selectively includes an insulating layer 140 and a plurality of conductive patterns 150. The conductive patterns 150 are respectively overlapped on the plurality of epitaxial structures 110P and are positioned between the plurality of contact pads 120 and the circuit substrate 50. The plurality of contact pads 120 are electrically connected to the circuit substrate 50 via the conductive patterns 150 respectively. However, the invention is not limited thereto. According to other embodiments, the plurality of contact pads 120 can also be electrically connected to the circuit substrate 50 directly. Further, the micro light emitting device display apparatus 1 further includes a planarization layer 160 and a conductive layer CE. The planarization layer 160 is disposed between the epitaxial structures 110P. Each of the epitaxial structures 110P has a side surface 110Ps facing another epitaxial structure 110P, and the planarization layer 160 covers the side surface 110Ps of each epitaxial structure 110P. In the present embodiment, the materials of the insulating layer 140 and the planarization layer 160 include an inorganic material (such as silicon oxide, silicon nitride, silicon oxynitride, other suitable materials, or a stack layer of the at least two materials), an organic material, or other suitable materials, or a combination of the above materials.

Based on the above, the conductive layer CE covers the plurality of epitaxial structures 110P and the planarization layer 160 and is electrically connected to the epitaxial structures 110P. In other words, in the present embodiment, the conductive layer CE can be a common electrode, but the invention is not limited thereto. In other embodiments, the conductive layer can also be a plurality of conductive wires separated from each other, and each of the conductive wires is electrically connected to a part of the epitaxial structures 110P. Particularly, in the present embodiment, the conductive layer CE and the contact pads 120 are respectively positioned at two opposite sides of the epitaxial structures 110P. That is, in the present embodiment, a micro light emitting device formed by a part of the contact pads 120, the conductive layer CE and the epitaxial structures 110P is, for example, a vertical-type light emitting diode device.

For example, when the micro light emitting device display apparatus 1 is enabled, the contact pads 120 can have a high potential, and the conductive layer CE can have a ground potential or a low potential. The current generated by the potential difference between the contact pads 120 and the conductive layer CE enables the corresponding epitaxial structure 110P to emit a (visible) light beam. More specifically, the micro light emitting device display apparatus 1 can be controlled by an active component of the circuit substrate 50, and the plurality of contact pads 120 have different high potentials respectively, so that the epitaxial structures 110P emit light beams with different intensities due to different driving currents to form an image to be visualized by human eyes.

It is worth mentioning that when the micro light emitting device display apparatus 1 is enabled, the arrangement of the light shielding patterns 130 can prevent the light beams from the epitaxial structures 110P from being irradiated on the circuit substrate 50 and causing degradation of the active component (such as a thin film transistor) on the circuit substrate 50. In other words, the arrangement of the light shielding patterns 130 is favorable for improving the operational stability of the driving circuit and the reliability under long-time operation. The fabricating processes of the micro light emitting device display apparatus 1 as shown in FIG. 1H will be exemplarily explained below.

Figure 1A:
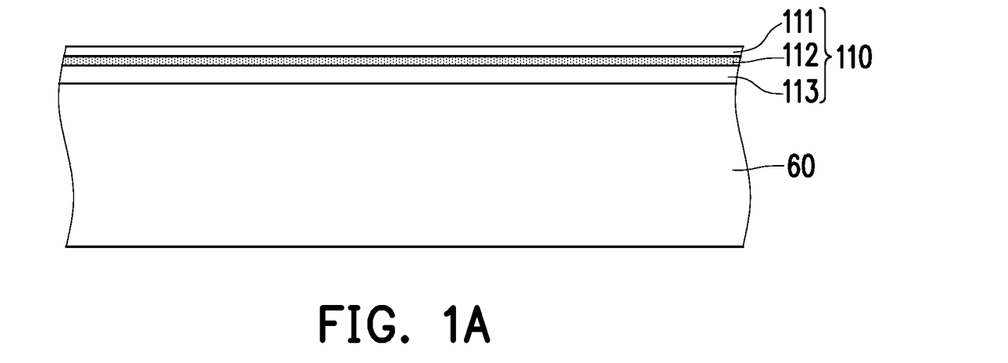
FIG. 1A to FIG. 1H are cross-sectional schematic views of fabricating processes of a micro light emitting device display apparatus according to a first embodiment of the invention.
Figure 1B:
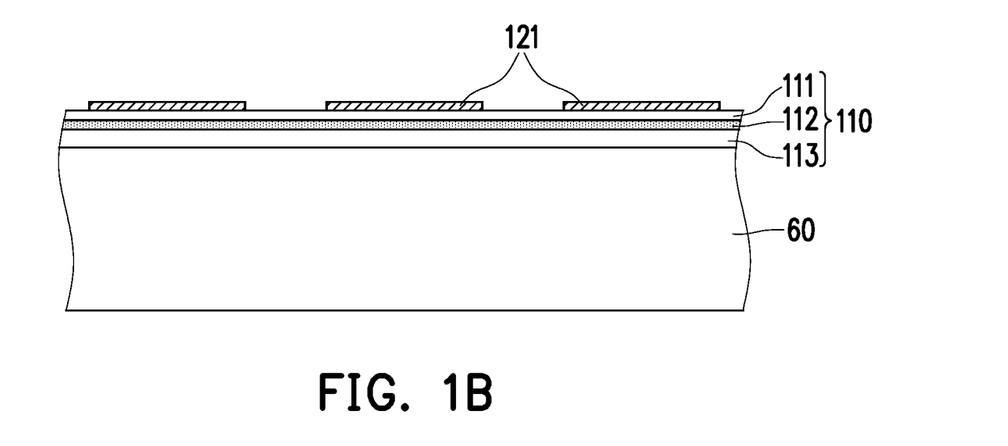
Figure 2:
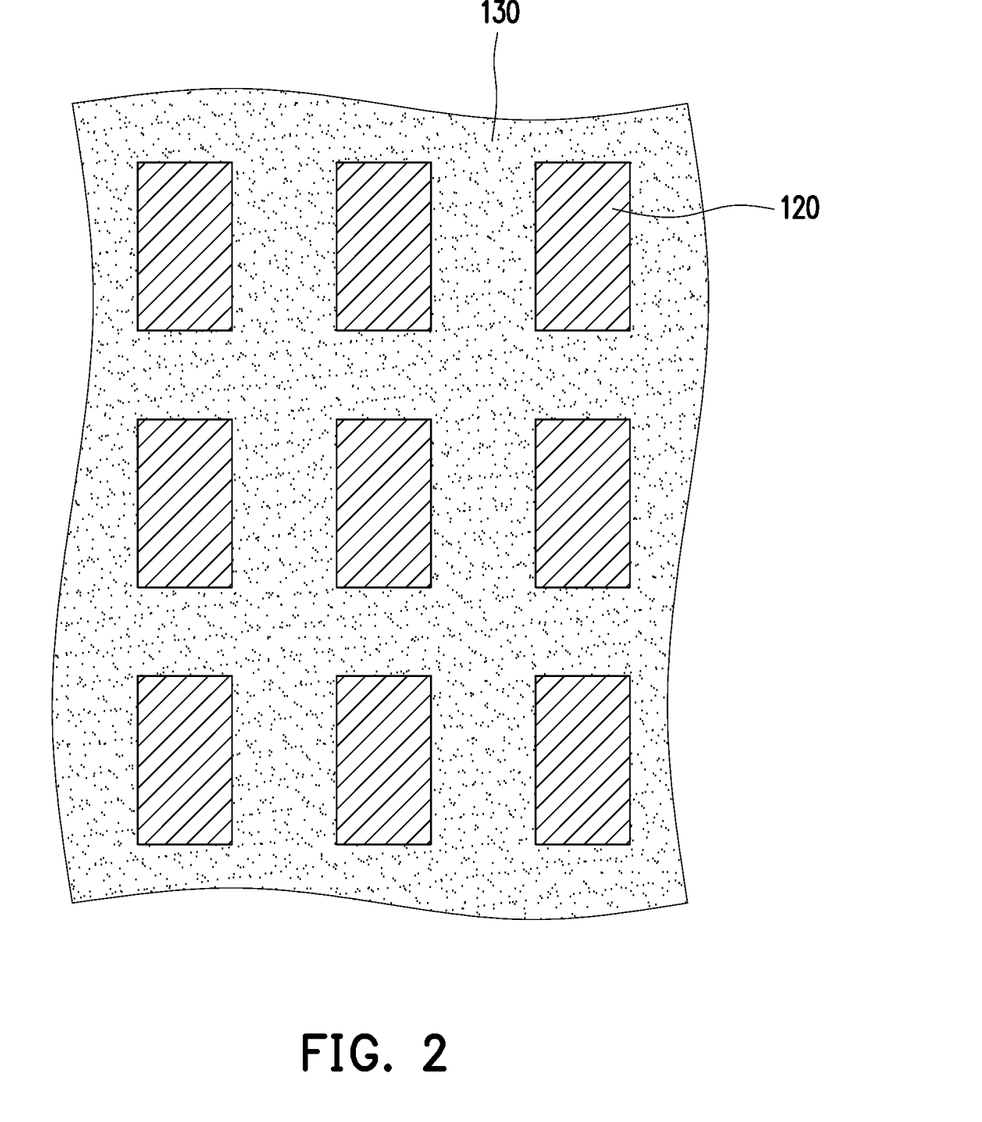
FIG. 2 is a top view of contact pads and light shielding patterns in FIG. 1H.

Referring to FIG. 1A, firstly, an epitaxial layer 110 is formed on an epitaxial substrate 60. For example, the epitaxial layer 110 includes a second-type semiconductor layer 113, a light emitting layer 112 and a first-type semiconductor layer 111 which are sequentially stacked on the epitaxial substrate 60. In the present embodiment, the first-type semiconductor layer 111 is, for example, a P-type semiconductor, the second-type semiconductor layer 113 is, for example, an N-type semiconductor, and the light emitting layer 112 can be a multiple quantum well (MQW) layer, but the invention is not limited thereto. Subsequently, a plurality of first sub-contact pads 121 separated from each other are formed on the epitaxial layer 110, as shown in FIG. 1B. Each of the first sub-contact pads 121 is composed of a conductive material such as gold or gold-tin alloy. The first sub-contact pads 121 and the epitaxial layer 110 may form an ohmic contact to serve as an electrode of a micro LED.

Figure 1C:
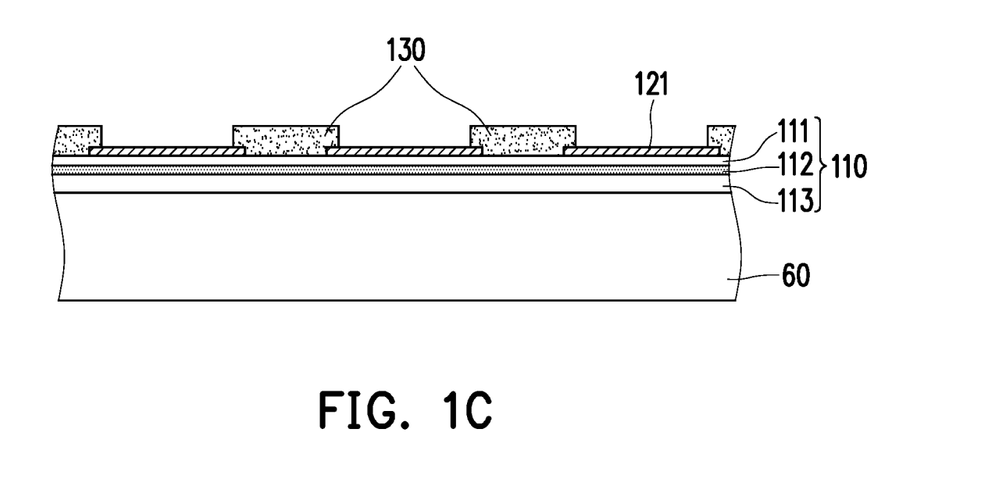

Referring to FIG. 1C, after the plurality of first sub-contact pads 121 are formed, a plurality of light shielding patterns 130 are formed on the epitaxial layer 110, where the light shielding patterns 130 and the plurality of first sub-contact pads 121 are alternately arranged on the epitaxial layer 110, but the invention is not limited thereto. In the present embodiment, the light shielding patterns 130 are not overlapped with the plurality of first sub-contact pads 121 in a direction perpendicular to the epitaxial substrate 60. More specifically, the plurality of light shielding patterns 130 align with the plurality of first sub-contact pads 121, but the invention is not limited thereto. In other embodiments, adjacent light shielding patterns and the first sub-contact pads 121 can also be separated from each other.

Figure 1D:
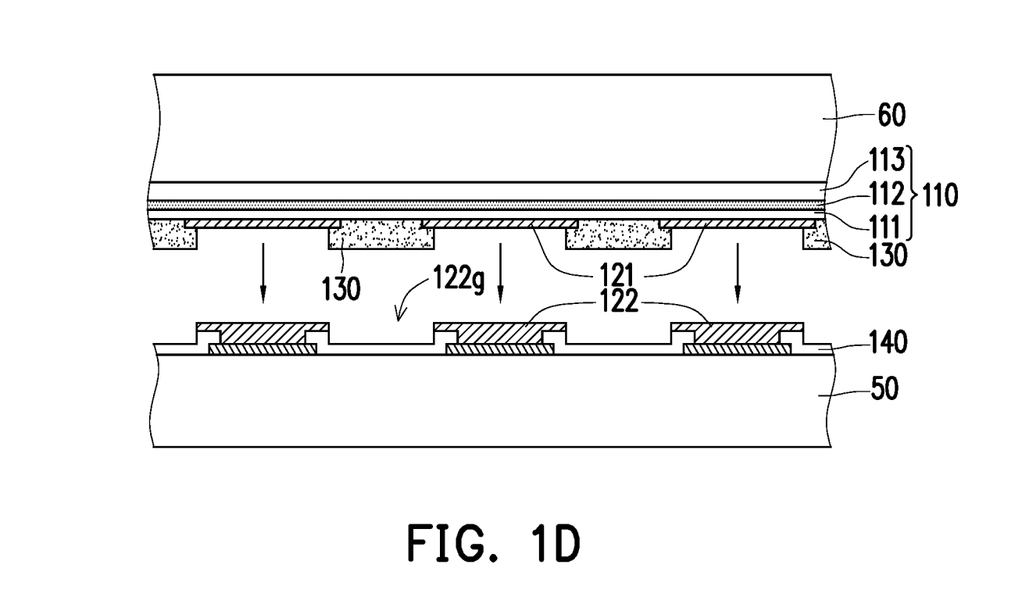

Subsequently, the epitaxial substrate 60 is bonded to the circuit substrate 50, as shown in FIG. 1D. For example, before the epitaxial substrate 60 is bonded to the circuit substrate 50, a plurality of second sub-contact pads 122 can be formed on the circuit substrate 50, and the second sub-contact pads 122 are corresponding to the plurality of first sub-contact pads 121 on the epitaxial layer 110, but the invention is not limited thereto. For example, the second sub-contact pads 122 may be bumps and mainly formed of Sn or an Sn alloy, but the invention is not limited thereto. Particularly, in some embodiments, before the epitaxial substrate 60 is bonded to the circuit substrate 50, the plurality of light shielding patterns 130 can also be disposed between the plurality of second sub-contact pads 122 in advance. That is, the plurality of light shielding patterns 130 and the plurality of second sub-contact pads 122 are alternately arranged on the circuit substrate 50. In the present embodiment, an insulating layer 140 and conductive patterns 150 can also be disposed on the circuit substrate 50, where the conductive patterns 150 are disposed between the second sub-contact pads 122 and the circuit substrate 50, and the second sub-contact pads 122 penetrate through the insulating layer 140 and are electrically connected to the conductive patterns 150, but the invention is not limited thereto. In other words, the conductive patterns 150 are the wires on the circuit substrate 50.

In this step, each of the light shielding patterns 130 on the epitaxial layer 110 can extend into a gap 122g between two corresponding second sub-contact pads 122 on the circuit substrate 50 to connect the insulating layer 140 on the circuit substrate 50, but the invention is not limited thereto. According to other embodiments, each of the light shielding patterns 130 can also be directly connected to the circuit substrate 50. Particularly, after the epitaxial substrate 60 is bonded to the circuit substrate 50, the plurality of first sub-contact pads 121 are respectively connected to the plurality of second sub-contact pads 122 to form a plurality of contact pads 120. However, the invention is not limited thereto. According to other embodiments, before the epitaxial substrate 60 is bonded to the circuit substrate 50, the plurality of contact pads 120 can also be formed on the epitaxial substrate 60 or the circuit substrate 50 in advance.

Figure 1E:
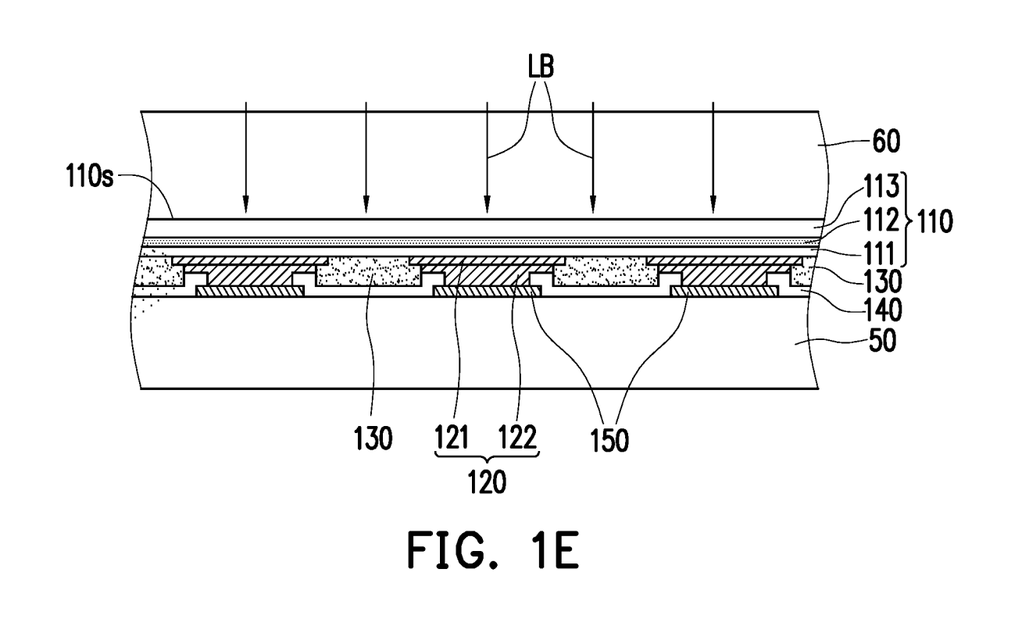
Figure 1F:
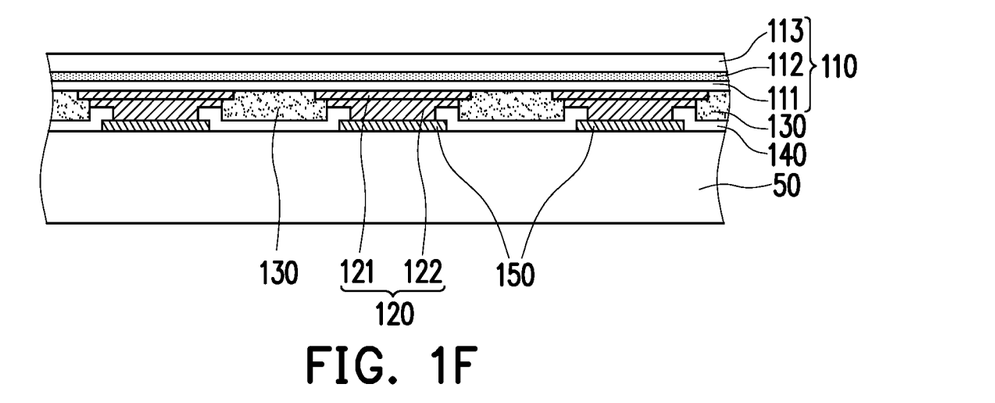

Referring to FIG. 1E and FIG. 1F, after the epitaxial layer 110 is bonded to the circuit substrate 50, the epitaxial substrate 60 is removed. For example, the method of removing the epitaxial substrate 60 includes a laser lift-off (LLO) process. In detail, the contact surface 110s of the epitaxial layer 110 and the epitaxial substrate 60 can be irradiated from one side of the epitaxial substrate 60 away from the epitaxial layer 110 by using the laser light LB to separate the second-type semiconductor layer 113 from the epitaxial substrate 60. However, the invention is not limited thereto. According to other embodiments, the epitaxial substrate 60 can also be removed by a polishing process. On the other hand, in order to reduce the service power of the laser light LB to achieve the objective of energy saving, before the LLO process, a thinning process can be performed for the epitaxial substrate 60 to reduce the light energy loss when the laser light LB passes through the epitaxial substrate 60. In such an embodiment, the thickness of the epitaxial substrate 60 may be reduced to 550 to 650 um, for example. It is worth mentioning that in the process of irradiating the epitaxial layer 110 by the laser light LB, the light shielding patterns 130 can effectively absorb the laser light LB, thereby preventing the circuit substrate 50 from being irradiated by the laser light LB and damaged, and being favorable for improving the overall production yield.

Figure 1G:
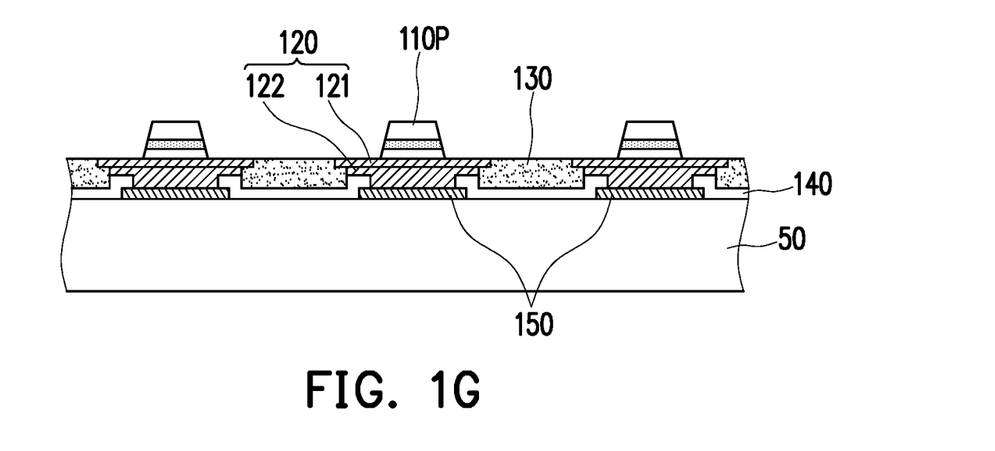
Figure 1H:
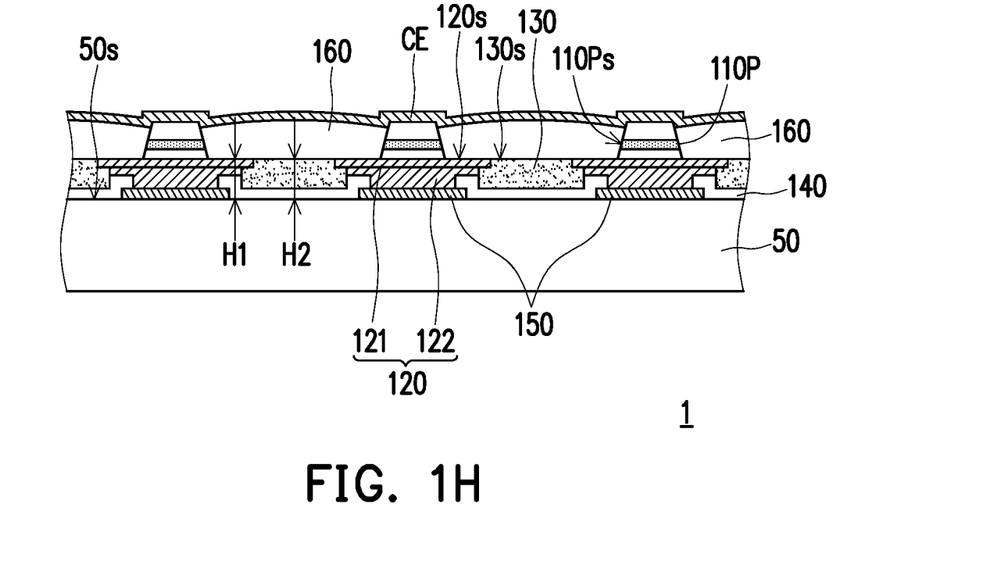

After the epitaxial substrate 60 is removed, a part of the epitaxial layer 110 is removed to form a plurality of epitaxial structures 110P (that is, a patterning process is performed for the epitaxial layer 110), as shown in FIG. 1G. Specifically, the epitaxial structures 110P are corresponding to the plurality of contact pads 120 and are electrically connected to the circuit substrate 50 via the contact pads 120 respectively. It is worth mentioning that after the epitaxial layer 110 is bonded to the circuit substrate 50, a part of the epitaxial layer 110 is removed and a plurality of epitaxial structures 110P are formed, so that the fabrication of the micro light emitting device display apparatus with an ultra high definition (UHD) can be realized, and the light emitting efficiency of the formed epitaxial structures 110P is also better.

Subsequently, a planarization layer 160 is formed between the plurality of epitaxial structures 110P, and the planarization layer 160 covers parts of the surfaces 120s of the contact pads 120, the light shielding patterns 130 and at least parts of the side surfaces 110Ps of the epitaxial structures 110P, as shown in FIG. 1H. After the planarization layer 160 is formed, a conductive layer CE is formed on the planarization layer 160. The conductive layer CE is connected to the planarization layer 160 and extends to cover the plurality of epitaxial structures 110P to electrically connect the epitaxial structures 110P. Therefore, the micro light emitting device display apparatus 1 of the present embodiment is completed.

As can be seen from FIG. 1H, the micro light emitting device display apparatus 1 includes a circuit substrate 50, a plurality of epitaxial structures 110P, a plurality of contact pads 120 and a plurality of light shielding patterns 130. The plurality of epitaxial structures 110P are dispersedly arranged on the circuit substrate 50. The plurality of contact pads 120 are disposed between the plurality of epitaxial structures 110P and the circuit substrate 50. The plurality of epitaxial structures 110P are electrically connected to the circuit substrate 50 via the plurality of contact pads 120 respectively. The plurality of light shielding patterns 130 and the plurality of contact pads 120 are alternately arranged on the circuit substrate 50, and each of the light shielding patterns 130 can be connected between two adjacent contact pads 120.

In the present embodiment, based on the consideration of conductivity, the material of the contact pads 120 is generally a metal material. However, the invention is not limited thereto. According to other embodiments, the material of the contact pads 120 can also be other conductive materials, such as alloys, nitrides of metal materials, oxides of metal materials, nitrogen oxides of metal materials, or other suitable materials, or a stack layer of metal materials and other conductive materials. On the other hand, the conductive layer CE is, for example, a light penetrable electrode, and the material of the light penetrable electrode includes metal oxides, such as an indium tin oxide, an indium zinc oxide, an aluminum tin oxide, an aluminum zinc oxide, or other suitable oxides, or a stack layer of the at least two oxides. In other words, the micro light emitting device display apparatus 1 of the present embodiment is a top emission-type display apparatus.

The following embodiments follow the element reference numbers and partial content of the foregoing embodiments, where same reference numbers are used to represent the same or like elements and descriptions of same technical content is omitted. Descriptions of the omitted part may refer to the foregoing embodiments and are not described in the following embodiments again.

Figure 3:
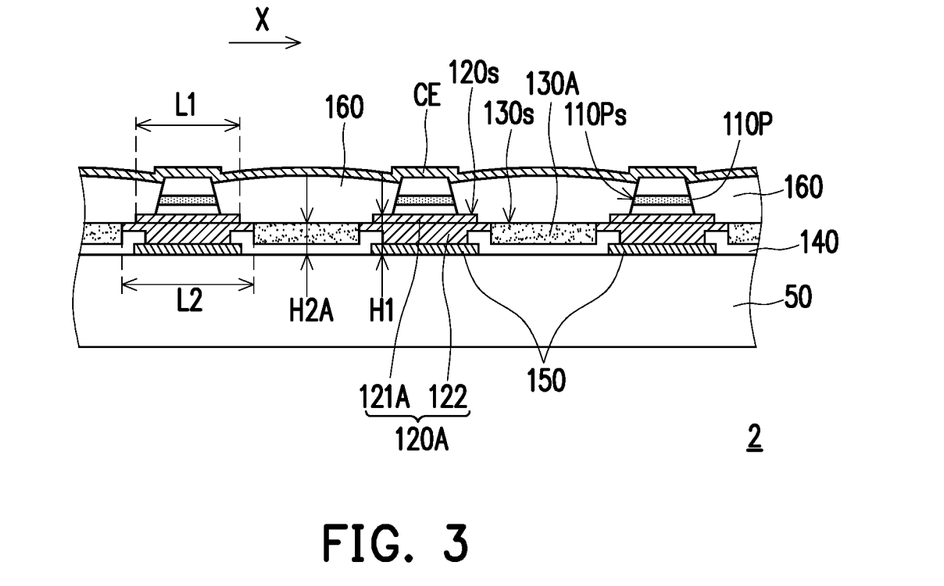
FIG. 3 is a cross-sectional schematic view of a micro light emitting device display apparatus according to a second embodiment of the invention.

FIG. 3 is a cross-sectional schematic view of a micro light emitting device display apparatus according to a second embodiment of the invention. Referring to FIG. 3, the main difference between a micro light emitting device display apparatus 2 of the present embodiment and the micro light emitting device display apparatus 1 in FIG. 1H is as follows: the configurations of the contact pads are different. In the present embodiment, first sub-contact pads 121A and second sub-contact pads 122 of contact pads 120A have a first length L1 and a second length L2 respectively in a direction X, and the first length L1 is less than the second length L2. In detail, after a plurality of second sub-contact pads 122 are formed, a plurality of light shielding patterns 130 can also be formed between the second sub-contact pads 122, and each of the light shielding patterns 130 protrudes from two adjacent second sub-contact pads 122 to a direction away from the circuit substrate 50.

In the present embodiment, because the first length L1 of the first sub-contact pads 121A is less than the second length L2 of the second sub-contact pads 122, the process margin (such as the allowable value of the alignment accuracy) when the epitaxial substrate 60 is bonded to the circuit substrate 50 (as shown in FIG. 1D) can be increased. Further, another difference between the micro light emitting device display apparatus 2 of the present embodiment and the micro light emitting device display apparatus 1 in FIG. 1H is as follows: before the epitaxial substrate 60 is bonded to the circuit substrate 50 (as shown in FIG. 1D), light shielding patterns 130A are already formed on the circuit substrate 50.

In the present embodiment, the first height H1 between the surfaces 120s of the contact pads 120 and the circuit substrate 50 can be greater than the second height H2A between the surfaces 130s of the light shielding patterns 130A and the circuit substrate 50, and the surfaces 130s of the light shielding patterns 130A substantially can align with the connecting surfaces 122s of the first sub-contact pads 121 and the second sub-contact pads 122, but the invention is not limited thereto. Therefore, the process margin when the epitaxial substrate 60 is bonded to the circuit substrate 50 (as shown in FIG. 1D) can be increased.

Figure 4:
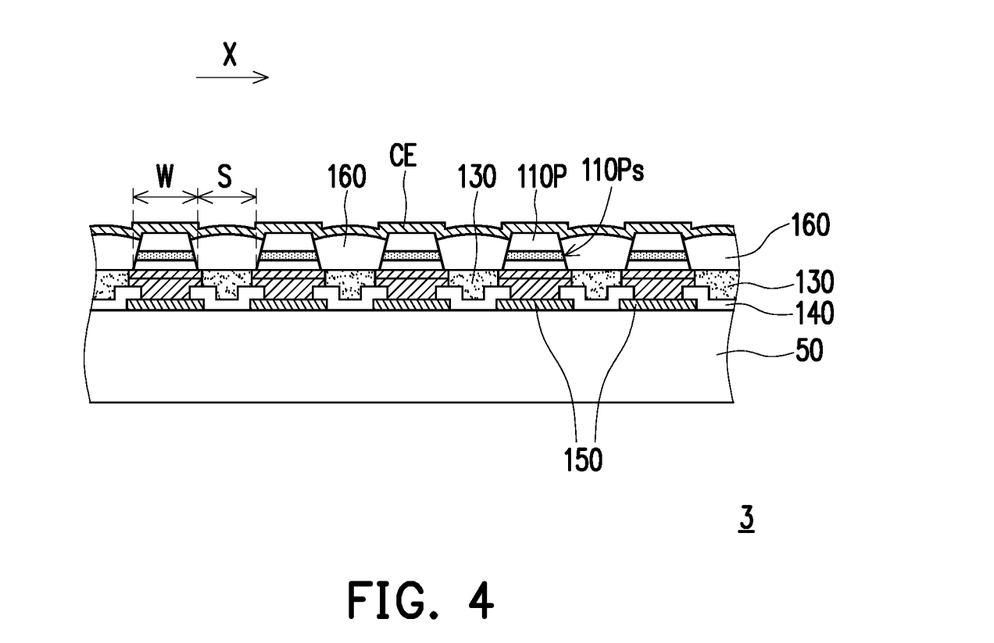
FIG. 4 is a cross-sectional schematic view of a micro light emitting device display apparatus according to a third embodiment of the invention.

FIG. 4 is a cross-sectional schematic view of a micro light emitting device display apparatus according to a third embodiment of the invention. Referring to FIG. 4, the difference between a micro light emitting device display apparatus 3 of the present embodiment and the micro light emitting device display apparatus 1 in FIG. 1H is as follows: the intervals between the plurality of epitaxial structures 110P are different. In the present embodiment, the epitaxial structures 110P have a bottom width W in the direction X, any two adjacent epitaxial structures 110P have an interval S in the direction X, and the bottom width W is greater than the interval S. In other words, the micro light emitting device display apparatus 3 of the present embodiment is a display apparatus with an ultra high definition, and can be produced through the fabricating processes shown in FIG. 1A to FIG. 1H.

Figure 5:
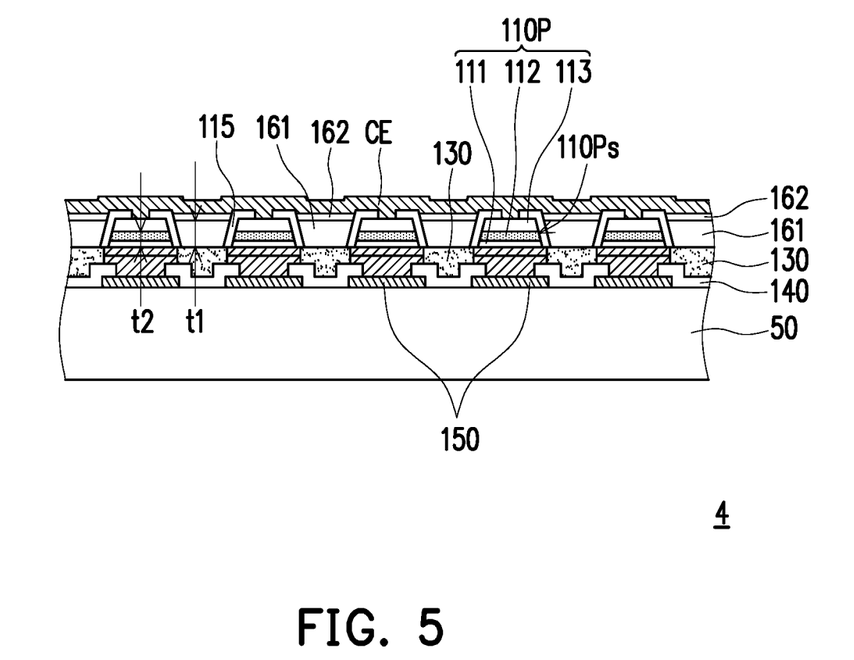
FIG. 5 is a cross-sectional schematic view of a micro light emitting device display apparatus according to a fourth embodiment of the invention.

FIG. 5 is a cross-sectional schematic view of a micro light emitting device display apparatus according to a fourth embodiment of the invention. Referring to FIG. 5, the difference between a micro light emitting device display apparatus 4 of the present embodiment and the micro light emitting device display apparatus 3 in FIG. 4 is as follows: the components between two adjacent epitaxial structures 110P are different. In the present embodiment, a reflective layer 161 and a light absorbing layer 162 stacked on the reflective layer 161 can also be formed between the plurality of epitaxial structures 110P of the micro light emitting device display apparatus 4. The reflective layer 161 covers at least parts of the side surfaces 110Ps of the epitaxial structures 110P. More specifically, the reflective layer 161 covers the first-type semiconductor layer 111, the light emitting layer 112 and at least a part of the second-type semiconductor layer 113.

From another point of view, in the normal direction of the circuit substrate 50, the reflective layer 161 has a first thickness t1, the first-type semiconductor layer 111 and the light emitting layer 112 have a second thickness t2, and the first thickness t1 is greater than the second thickness t2 and is less than the height of the epitaxial structures 110P. Therefore, the light beams emitted by the light emitting layer 112 can be prevented from being emitted from the side surfaces 110Ps of the epitaxial structures 110P, thereby being favorable for improving the light extraction efficiency of the epitaxial structures 110P.

In the present embodiment, the material of the reflective layer 161 can be a metal having a reflectivity greater than 90%, or a metal compound material such as aluminum, silver or a Bragg reflector, but is not limited thereto. It should be understood that because the reflective layer 161 of the present embodiment can be made of a metal material, in order to avoid electrical short circuit between the plurality of epitaxial structures 110P, the micro light emitting device display apparatus 4 can also include an insulating layer 115 disposed between the epitaxial structures 110P and the reflective layer 161, where the conductive layer CE penetrates through the insulating layer 115 and is electrically connected to the second-type semiconductor layer 113. On the other hand, by the absorbing layer 162 disposed on the reflective layer 161, the mixed light generated by two light beams emitted by two adjacent epitaxial structures 110P can be reduced. In other words, the image definition of the micro light emitting device display apparatus 4 can be improved.

Figure 6:
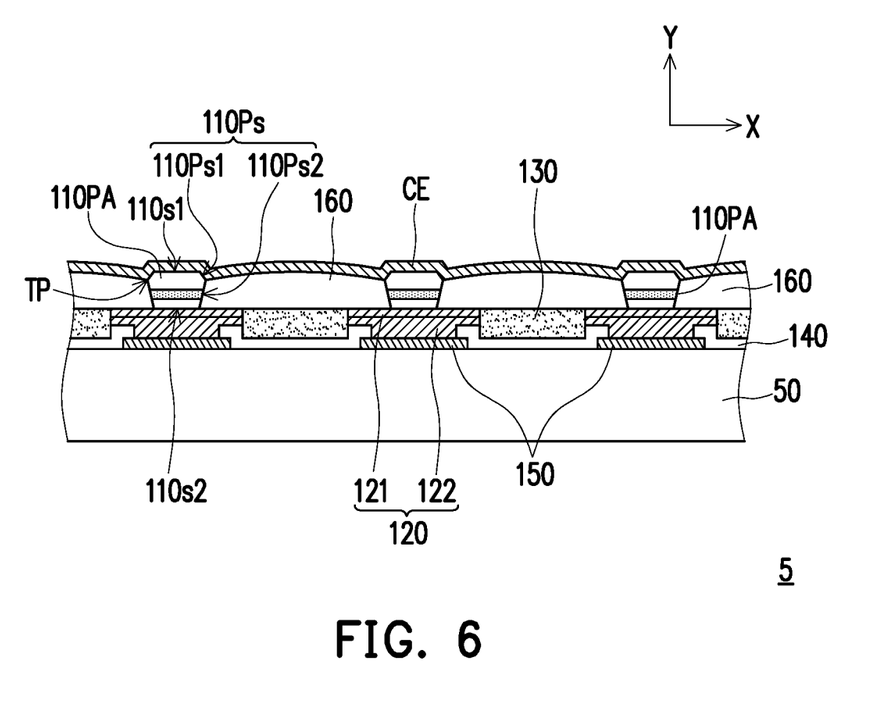
FIG. 6 is a cross-sectional schematic view of a micro light emitting device display apparatus according to a fifth embodiment of the invention.

FIG. 6 is a cross-sectional schematic view of a micro light emitting device display apparatus according to a fifth embodiment of the invention. Referring to FIG. 6, the difference between a micro light emitting device display apparatus 5 of the present embodiment and the micro light emitting device display apparatus 1 in FIG. 1H is as follows: the configurations of the epitaxial structures are different. In the present embodiment, each of epitaxial structures 110PA has a top surface 110s1 and a bottom surface 110s2 which are opposite to each other, and each of side surfaces 110Ps is connected between the top surface 110s1 and the bottom surface 110s2. Each of the side surfaces 110Ps includes a first part 110Ps1 and a second part 110Ps2, and the first part 110Ps1 is connected to the second part 110Ps2 to form a turning position TP. It is worth mentioning that the width of each of the epitaxial structures 110PA gradually increases from the top surface 110s1 to the turning position TP and gradually decreases from the turning position TP to the bottom surface 110s2. In other words, the projection of the epitaxial structures 110PA of the present embodiment on an XY plane can have a diamond-like outer contour. Therefore, the risk of film breakage or disconnection of the conductive layer CE formed on the epitaxial structures 110PA and the planarization layer 160 in the subsequent process can be reduced.

Based on the above, in the micro light emitting device display apparatus and the method of fabricating the same according to an embodiment of the invention, by the arrangement of the plurality of light shielding patterns, the circuit substrate can be prevented from being damaged in the process of removing the epitaxial substrate. Furthermore, when the micro light emitting device display apparatus is enabled, the light shielding patterns can also prevent the light beams emitted from the epitaxial structures from entering the circuit substrate, thereby being favorable for improving the operational stability of the driving circuit and the reliability under long-time operation. On the other hand, after the epitaxial layer is bonded to the circuit substrate, a part of the epitaxial layer is removed and a plurality of epitaxial structures are formed, so that the fabrication of the micro light emitting device display apparatus with better display quality can be realized, and the light emitting efficiency of the formed epitaxial structures is also better.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A micro light emitting device display apparatus, comprising:
    a circuit substrate;
    a plurality of epitaxial structures, dispersedly arranged on the circuit substrate;
    a plurality of contact pads, disposed between the epitaxial structures and the circuit substrate, wherein the epitaxial structures are electrically connected to the circuit substrate via the contact pads respectively; and
    a plurality of light shielding patterns, wherein the light shielding patterns and the contact pads are alternately arranged on the circuit substrate, and each of the light shielding patterns is connected between two adjacent contact pads without overlapping with the contact pads and is adapted to block light with a wavelength ranging from 150 nm to 400 nm from penetrating through,
    wherein the circuit substrate comprises a surface, a first surface of each of the contact pads has a first height from the surface of the circuit substrate, a second surface of each of the light shielding patterns has a second height from the surface of the circuit substrate, and the second height is less than or equal to the first height.

2. The micro light emitting device display apparatus according to claim 1, wherein each of the contact pads comprises a first sub-contact pad and a second sub-contact pad, the first sub-contact pad is connected to one of the epitaxial structures, and the second sub-contact pad is connected between the first sub-contact pad and the circuit substrate, wherein the first sub-contact pad has a first length in a direction, the second sub-contact pad has a second length in the direction, and the first length is equal to or less than the second length.

3. The micro light emitting device display apparatus according to claim 1, wherein a Young's modulus of the light shielding pattern ranges from 2.9 GPa to 3.6 GPa.

4. The micro light emitting device display apparatus according to claim 1, wherein the light shielding patterns are connected to each other and surround the contact pads.

5. The micro light emitting device display apparatus according to claim 1, further comprising:
    a planarization layer, disposed between the epitaxial structures and covering a side surface of each of the epitaxial structures; and
    a conductive layer, covering the epitaxial structures and the planarization layer and electrically connected to the epitaxial structures.

6. The micro light emitting device display apparatus according to claim 1, wherein each of the epitaxial structures comprises a top surface and a bottom surface which are opposite to each other and a side surface connected to the top surface and the bottom surface, the side surface comprises a first part and a second part, the first part is connected to the second part to form a turning position, and a width of the epitaxial structure gradually increases from the top surface to the turning position and gradually decreases from the turning position to the bottom surface.

7. The micro light emitting device display apparatus according to claim 1, further comprising:
    a reflective layer, disposed between the epitaxial structures.

8. The micro light emitting device display apparatus according to claim 7, further comprising:
    a light absorbing layer, disposed on the reflective layer.

9. The micro light emitting device display apparatus according to claim 7, wherein each of the epitaxial structures comprises:
    a first-type semiconductor layer, electrically connected to a corresponding contact pad;
    a light emitting layer, disposed on the first-type semiconductor layer; and
    a second-type semiconductor layer, disposed on the light emitting layer, wherein the reflective layer is higher than the light emitting layer.

10. The micro light emitting device display apparatus according to claim 9, wherein the reflective layer has a first thickness in a normal direction of the circuit substrate, the light emitting layer and the first-type semiconductor layer have a second thickness in the normal direction of the circuit substrate, and the first thickness is greater than the second thickness.

11. A method of fabricating a micro light emitting device display apparatus, comprising:
    forming an epitaxial layer on an epitaxial substrate, and forming a plurality of first sub-contact pads separated from each other on the epitaxial layer;
    forming a plurality of second sub-contact pads separated from each other on a circuit substrate;
    bonding the epitaxial substrate to the circuit substrate;
    electrically bonding the first sub-contact pads and the second sub-contact pads to form a plurality of contact pads electrically connected to the epitaxial layer and the circuit substrate;
    forming a plurality of light shielding patterns between the epitaxial substrate and the circuit substrate, wherein the light shielding patterns and the second sub-contact pads are alternately arranged on the circuit substrate, the light shielding patterns are not overlapped with the second sub-contact pads, and the light shielding patterns are capable of blocking light with a wavelength ranging from 150 mu to 400 nm from penetrating through;
    after the circuit substrate is bonded to the epitaxial substrate, removing the epitaxial substrate; and
    etching the epitaxial layer to form a plurality of epitaxial structures, wherein the epitaxial structures respectively correspond to the contact pads and are electrically connected to the circuit substrate via the contact pads respectively.

12. The method of fabricating a micro light emitting device display apparatus according to claim 11, further comprising:
    forming the light shielding patterns on the epitaxial layer before the epitaxial substrate is bonded to the circuit substrate.

13. The method of fabricating a micro light emitting device display apparatus according to claim 11, further comprising:
  forming the light shielding patterns on the circuit substrate before the epitaxial substrate is bonded to the circuit substrate.

14. The method of fabricating a micro light emitting device display apparatus according to claim 11, wherein each of the first sub-contact pads has a first length in a direction, each of the second sub-contact pads has a second length in the direction, and the first length is equal to or less than the second length.

15. The method of fabricating a micro light emitting device display apparatus according to claim 11, further comprising:
  performing a thinning process on the epitaxial substrate, wherein the step of removing the epitaxial substrate comprises performing a laser lift-off process.

16. The method of fabricating a micro light emitting device display apparatus according to claim 11, wherein each of the epitaxial structures comprises a top surface and a bottom surface which are opposite to each other and a side surface connected to the top surface and the bottom surface, the side surface comprises a first part and a second part, the first part is connected to the second part to form a turning position, and a width of the epitaxial structure gradually increases from the top surface to the turning position and gradually decreases from the turning position to the bottom surface.

17. The method of fabricating a micro light emitting device display apparatus according to claim 11, further comprising:
  forming a reflective layer between the epitaxial structures.

18. The method of fabricating a micro light emitting device display apparatus according to claim 17, further comprising:
  forming a light absorbing layer on the reflective layer.

* * * * *